(12) United States Patent
Misawa et al.

(10) Patent No.: US 7,404,248 B2
(45) Date of Patent: Jul. 29, 2008

(54) PRODUCING METHOD OF PRODUCING A SOLID PICKUP DEVICE

(75) Inventors: Takeshi Misawa, Saitama (JP); Akihisa Yamazaki, Saitama (JP); Atsushi Misawa, Saitama (JP)

(73) Assignee: Fujifilm Corporation, Tokyo (JP)

( * ) Notice: Subject to any disclaimer, the term of this patent is extended or adjusted under 35 U.S.C. 154(b) by 389 days.

(21) Appl. No.: 11/329,180

(22) Filed: Jan. 11, 2006

(65) Prior Publication Data

US 2006/0117550 A1 Jun. 8, 2006

Related U.S. Application Data

(62) Division of application No. 10/421,858, filed on Apr. 24, 2003, now Pat. No. 7,127,793.

(30) Foreign Application Priority Data

| Apr. 24, 2002 | (JP) | ............................. 2002-122389 |
| Apr. 24, 2002 | (JP) | ............................. 2002-122390 |
| May 14, 2002 | (JP) | ............................. 2002-138236 |

(51) Int. Cl.
*G01R 3/00* (2006.01)

(52) U.S. Cl. .......................... 29/595; 29/417; 29/592.1; 438/68; 369/125

(58) Field of Classification Search ................... 29/417, 29/592.1, 595; 369/125; 438/68
See application file for complete search history.

(56) References Cited

U.S. PATENT DOCUMENTS

| 4,957,882 A | * | 9/1990 | Shinomiya ................... 438/65 |
| 5,219,796 A | * | 6/1993 | Quinn et al. ................... 438/68 |
| 5,776,799 A | * | 7/1998 | Song et al. ................... 438/118 |
| 5,998,862 A | * | 12/1999 | Yamanaka ................... 257/704 |
| 6,046,070 A | * | 4/2000 | Shoji et al. ................... 438/66 |
| 6,168,965 B1 | | 1/2001 | Malinovich et al. |
| 6,352,875 B1 | | 3/2002 | Hayashi et al. |
| 6,636,185 B1 | | 10/2003 | Spitzer et al. |

FOREIGN PATENT DOCUMENTS

| JP | 61182016 A | 8/1986 |
| JP | 9-074523 | 3/1997 |
| JP | 2000-134528 | 5/2000 |
| JP | 2000-350105 | 12/2000 |
| JP | 2001-028431 | 1/2001 |

\* cited by examiner

*Primary Examiner*—Paul D Kim
(74) *Attorney, Agent, or Firm*—Birch, Stewart, Kolasch & Birch, LLP

(57) ABSTRACT

A producing method of producing a solid state pickup device is provided. Imaging elements are formed on a wafer in a matrix form. Each of the imaging elements has a light receiving surface and plural contact points. Receiving surface border portions are formed on a glass plate to protrude therefrom in a matrix form by etching. The receiving surface border portions are attached to the wafer to surround the light receiving surface in each of the receiving surface border portions. The light receiving surface is spaced from the glass plate. The glass plate is diced outside respectively the receiving surface border portions, to form shield glass for covering the light receiving surface. The wafer is diced for each of the imaging elements, to obtain the solid state pickup device having the shield glass and one of the imaging elements.

9 Claims, 16 Drawing Sheets

PRODUCING METHOD OF PRODUCING A SOLID PICKUP DEVICE

This application is a Divisional of application Ser. No. 10/421,858 filed on Apr. 24, 2003 now U.S. Pat. No. 7,127, 793, which claims priority of Japanese Application Nos. 2002-122389 filed on Apr. 24, 2002; 2002-122390 filed on Apr. 24, 2002; and 2002-138236 filed on May 14, 2002, and for which priority is claimed under 35 U.S.C. § 120. The entire contents of each of the above-identified applications are hereby incorporated by reference.

BACKGROUND OF THE INVENTION

1. Field of the Invention

The present invention relates to a producing method of a solid state pickup device, and attaching method and device for the same. More particularly, the present invention relates to a producing method of a solid state pickup device which can be assembled with high precision in positioning even without using a package, and attaching method and device for the same.

2. Description Related to the Prior Art

A solid state pickup element such as a CCD sensor is generally contained in a package with wiring, and used as a solid state pickup device. If there occurs offsetting between the solid state pickup element and a prism with respect to a path of the incident light, a signal is incorrectly generated due to a difference between an in-focus position of the light and an incident position of the solid state pickup element.

JP-A 9-074523 discloses a method of fixedly attaching the solid state pickup device to prevent offsetting in the position. The solid state pickup device is mounted on a base plate. A prism is opposed to the solid state pickup device in a path of passage of the light. Four support pins are fixed on, and project from, a prism case. Ends of the support pins are inserted in through holes at four corners of the base plate. The pin ends are attached to the through holes by soldering, to connect the support pins with the base plate.

JP-A 2000-350105 discloses a construction for reducing an error in the positioning in the connection between the support pins and the base plate.

However, there is a problem in a low precision in the positioning in those known techniques. This is because of the support pins used between the prism case and the base plate for positioning the solid state pickup device, or because of the support pins and the connection members used between a prism block and a base for attachment of the solid state pickup device.

JP-A 2001-028431 discloses a construction in which cutouts are formed in corners or edge portions of a package for fixing the solid state pickup element. Projections of a positioning mechanism are engaged with cutouts of the package, for positioning the package.

JP-A 2000-134528 discloses a method of positioning the solid state pickup element by monitoring an output of the solid state pickup element. However, this has a shortcoming in complexity and difficulty in the adjustment.

The solid state pickup device must be positioned and fixed in the camera. It is likely that degradation in the quality occurs due to unevenness in the sensitivity typically when there is no precise coincidence between an optical axis of the lens and that of the solid state pickup element as designed.

Thus, the prior art has a problem in high complexity in the positioning, because high precision is required in the positioning of the solid state pickup element in a package, and positioning the package relative to a lens block in a lens barrel.

In general, a package is used as a reference of positioning the solid state pickup element relative to the lens block in a camera with the solid state pickup element. However, there is no known technique of effectively simplifying, and heightening precision in, positioning of the solid state pickup element in a package, or positioning the package relative to the lens block in a lens barrel.

SUMMARY OF THE INVENTION

In view of the foregoing problems, an object of the present invention is to provide a producing method of a solid state pickup device which can be assembled easily with high precision in positioning even without using a package, and attaching method and device for the same.

In order to achieve the above and other objects and advantages of this invention, a producing method of a solid state pickup device is provided. Imaging elements are formed on a wafer in a matrix form, each of the imaging elements having a light receiving surface and plural contact points. Receiving surface border portions are formed on a glass plate to protrude therefrom in a matrix form by etching. The receiving surface border portions are attached to the wafer to surround the light receiving surface in each of the receiving surface border portions, the light receiving surface being spaced from the glass plate. The glass plate is diced outside respectively the receiving surface border portions, to form shield glass for covering the light receiving surface. The wafer is diced for each of the imaging elements, to obtain the solid state pickup device having the shield glass and one of the imaging elements.

The light receiving surface has substantially a quadrilateral shape, and the receiving surface border portions protrude substantially in a quadrilateral shape in a position about the light receiving surface.

The plural contact points are disposed outside the light receiving surface and outside a covered area of the shield glass.

According to one aspect of the invention, an attaching method of attaching a solid state pickup device to an electronic camera is provided. The electronic camera includes a lens barrel, and a condenser lens supported in the lens barrel. In the attaching method, the solid state pickup device is placed in a receiving recess formed in a rear portion of the lens barrel, the receiving recess having a size larger than the solid state pickup device. The solid state pickup device is pressed in an optical axis direction of the condenser lens and a crosswise direction crosswise to the optical axis direction, for fitting and positioning a front face and a partial end face of the solid state pickup device into the receiving recess.

The solid state pickup device includes an imaging element and a box-shaped shield glass, the imaging element has a light receiving surface and plural contact points, the shield glass has a plate portion and a receiving surface border portion, the plate portion is disposed over the light receiving surface, and the receiving surface border portion has substantially a quadrilateral shape, and attached to the imaging element to surround the light receiving surface.

The imaging element is pushed by a biasing force in the crosswise direction, and pressed against an inside of the receiving recess.

The imaging element has substantially a quadrilateral shape, and the crosswise direction comprises two directions defined along two adjacent side lines of the imaging element.

In a preferred embodiment, the imaging element has substantially a quadrilateral shape, and the crosswise direction is defined along a diagonal line of the imaging element.

According to another aspect of the invention, an attaching method includes placing the solid state pickup device in a receiving recess formed in a rear portion of the lens barrel, the receiving recess having a size larger than the solid state pickup device. The solid state pickup device is pressed in an optical axis direction of the condenser lens and a crosswise direction crosswise to the optical axis direction, for tightly fitting a front face and a partial end face of the solid state pickup device into the receiving recess, to position the solid state pickup device on the lens barrel, wherein the front face and the partial end face lacks the wiring pattern.

The solid state pickup device includes an imaging element having a light receiving surface directed to a front. A shield glass layer is attached to the imaging element to cover the light receiving surface. A reinforcing glass layer is attached to the imaging element on a side opposite to the light receiving surface.

The solid state pickup device has substantially a quadrilateral shape, and includes a first end face for being fitted in the receiving recess, a second end face disposed opposite to the first end face, first and second lateral faces directed opposite to each other, and a rear face directed opposite to the front face. The wiring pattern extends from at least one of the first and second lateral faces toward the rear face.

The solid state pickup device is pressed in the crosswise direction by a clamper or pressure pad.

The clamper includes first and second clamp jaws, biased toward each other, for clamping the solid state pickup device therebetween, to position the solid state pickup device in the optical axis direction.

The clamper clamps the second end face, or clamps a corner between the second end face and the second lateral face, and presses the first end face against the receiving recess, or presses a corner between the first end face and the first lateral face against the receiving recess.

In a preferred embodiment, the pressure pad has an inclined face directed toward a front with an inclination. The second end face is directed toward a rear with an inclination, pressed by the inclined face, to position the solid state pickup device in the optical axis direction.

Also, an attaching device for attaching a solid state pickup device to an electronic camera is provided. A receiving recess is formed in an inner portion of the lens barrel disposed behind the condenser lens, the solid state pickup device having a front face and a first end face of which at least one portion is engaged with the receiving recess, wherein the at least one portion lacks the wiring pattern. A pressure mechanism presses the solid state pickup device in an optical axis direction of the condenser lens and a crosswise direction crosswise to the optical axis direction, for tightly fitting the front face and the first end face into the receiving recess, to position the solid state pickup device fixedly on the lens barrel.

According to still another aspect of the invention, a producing method of producing a solid state pickup device is provided. Plural light receiving surfaces are formed on a wafer, each of the light receiving surfaces being adapted to convert incident light of an image to an electric signal. First and second grooves are formed in a shield glass plate substantially in parallel with each other. The shield glass plate is attached to the wafer by opposing the first and second grooves to positions offset from the light receiving surface, wherein ends of the first and second grooves appear externally. A reinforcing glass plate is attached to the wafer on a side opposite to the shield glass plate. The wafer, the shield glass plate and the reinforcing glass plate are diced together for each of the light receiving surfaces, to obtain the solid state pickup device. First and second projections are inserted into end openings of the first and second grooves, the first and second projections projecting from a first auxiliary panel, whereby the first auxiliary panel is connected with the solid state pickup device. Third and fourth projections are inserted into end openings of the first and second grooves, the third and fourth projections projecting from a second auxiliary panel, whereby the second auxiliary panel is connected with the solid state pickup device, the first and second auxiliary panels being adapted to attachment to an electronic camera.

The solid state pickup device is positioned in an optical axis direction thereof and in a first direction crosswise to the optical axis direction by engagement of the first and second grooves with the first to fourth projections. The solid state pickup device is positioned in a second direction crosswise to the optical axis direction by engagement of the shield glass plate with the first and second auxiliary panels.

In the groove forming step, plural pairs of the first and second grooves are formed in the shield glass plate.

The first and second auxiliary panels have holes with which the first and second auxiliary panels are fixed to a lens holder of the electronic camera.

Screws are used for fixation with the holes.

Furthermore, a coating is applied to surfaces of the first and second grooves in the shield glass plate, for preventing adhesive agent from being stuck.

Furthermore, a positioning indicia is formed on the shield glass plate at a portion of the first and second grooves, the positioning indicia being adapted for positioning the shield glass plate on the wafer.

The first and second grooves have a triangular shape as viewed in section.

In a preferred embodiment, the first and second grooves have a trapezoidal shape as viewed in section.

BRIEF DESCRIPTION OF THE DRAWINGS

The above objects and advantages of the present invention will become more apparent from the following detailed description when read in connection with the accompanying drawings, in which.

DETAILED DESCRIPTION OF THE PREFERRED EMBODIMENT(S) OF THE PRESENT INVENTION

Figure 1:
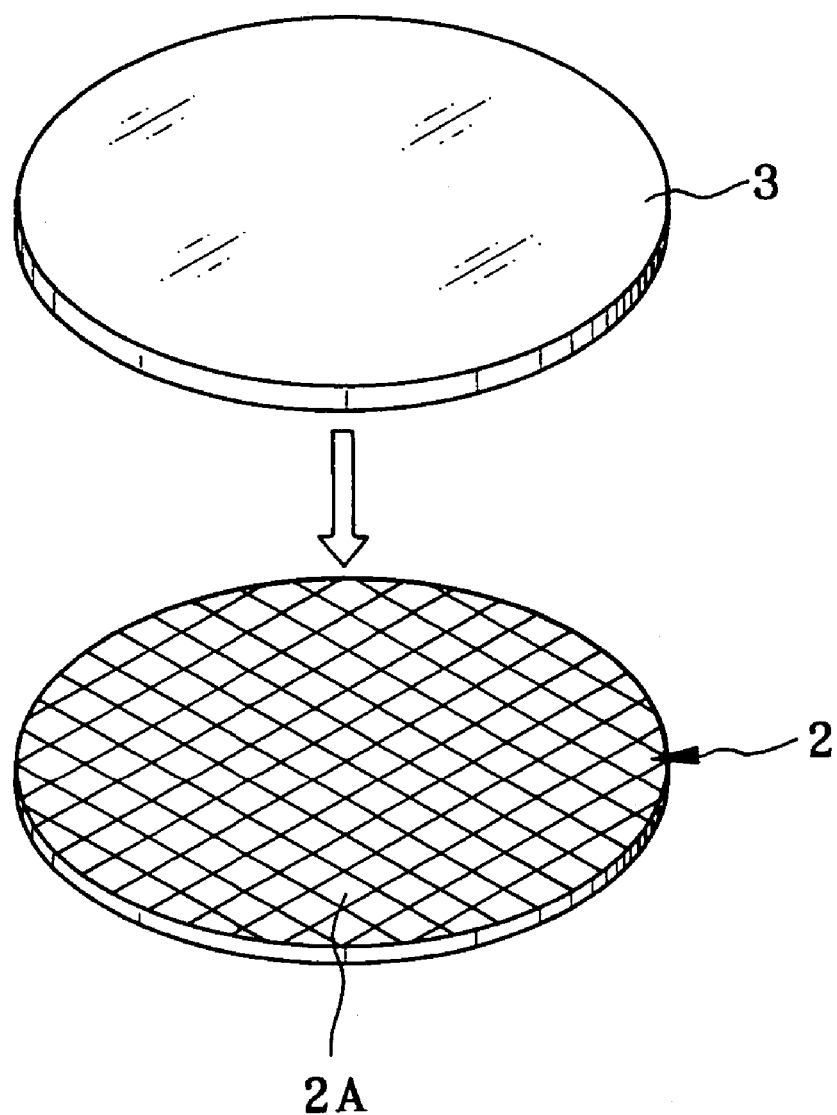
FIG. 1 is a perspective illustrating a producing process in which a glass plate is attached to a wafer for a solid state pickup device.

In FIG. 1, a process of producing a CCD sensor as solid state pickup device is illustrated. A wafer 2 is formed from silicon. Plural imaging elements 2A as chips are disposed on the wafer 2 in a form of a grid. A glass plate 3 or layer is attached to an upper surface of the wafer 2. Then the wafer 2 and the glass plate 3 are diced to obtain the CCD sensor.

Figure 2A:
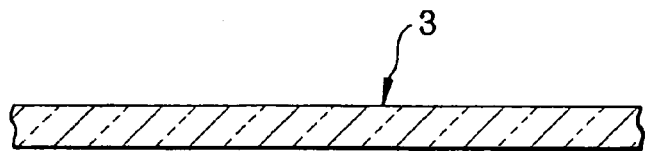
FIG. 2A is an explanatory view in section, illustrating a glass plate.
Figure 2B:
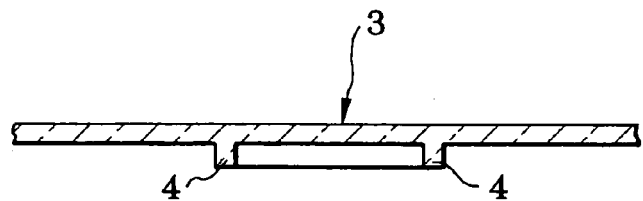
FIG. 2B is an explanatory view in section, illustrating a shield glass plate obtained by etching the glass plate.

In FIGS. 2A-2F, a producing process for a unit solid state pickup device is illustrated. At first, the glass plate 3 is prepared as illustrated in FIG. 2A. One surface of the glass plate 3 is subjected to patterning, and etched. In FIG. 2B, receiving surface border portions 4 or ridges are formed for defining borderlines between adjacent chip regions.

Figure 3:
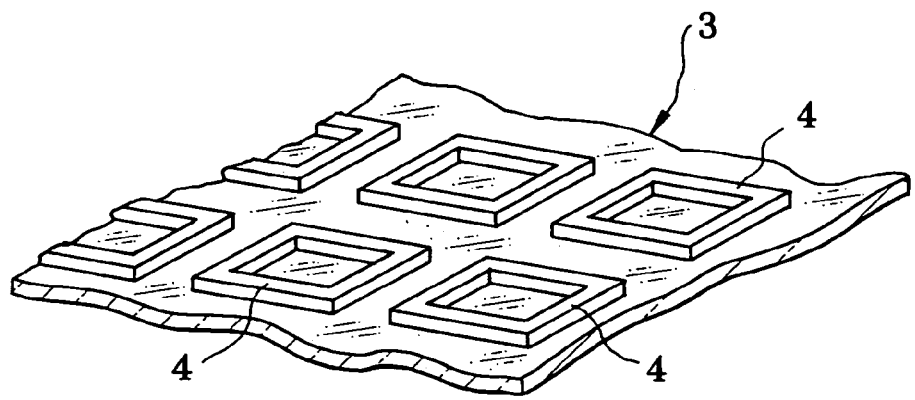
FIG. 3 is a perspective illustrating the shield glass plate obtained by etching.

A surface of the glass plate 3 after the etching has a plurality of chip regions arranged in a grid form and defined inside the receiving surface border portions 4. See FIG. 3.

Figure 2C:
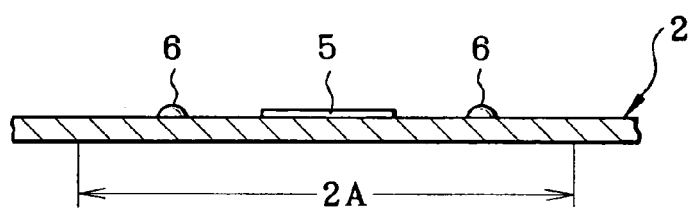
FIG. 2C is an explanatory view in section, illustrating a wafer having a light receiving surface.

The wafer 2 is a silicon substrate. In FIG. 2C, there are a light receiving surface 5 and contact points 6 arranged on one surface of the wafer 2 at each imaging element 2A. The light receiving surface 5 is provided with a photo diode, charge coupled element and micro lens. The contact points 6 are connected with an outer lead.

Figure 2D:
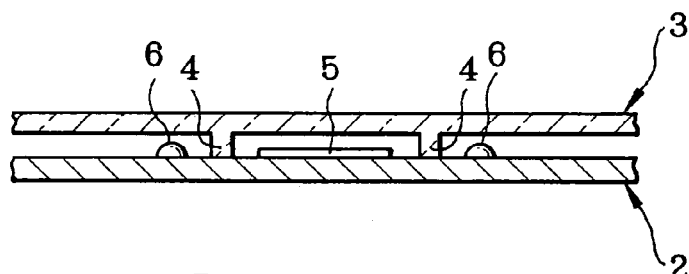
FIG. 2D is an explanatory view in section, illustrating an attached state of the shield glass plate to the wafer.

In FIG. 2D, the glass plate 3 is placed on the wafer 2. Ends of the receiving surface border portions 4 are attached to the wafer 2 by adhesion. The light receiving surface 5 on the wafer 2 is covered by the glass plate 3 having the receiving surface border portions 4 with a space.

Figure 2E:
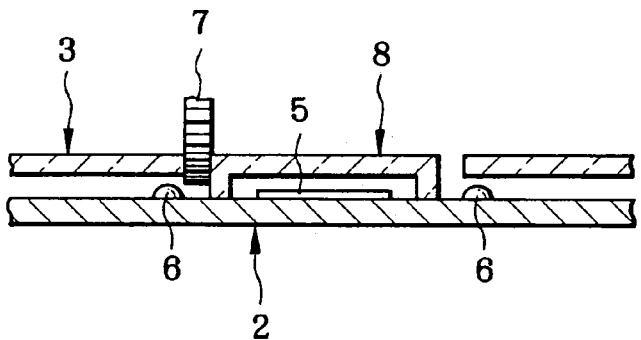
FIG. 2E is an explanatory view in section, illustrating a dicing process of the shield glass plate.
Figure 2F:
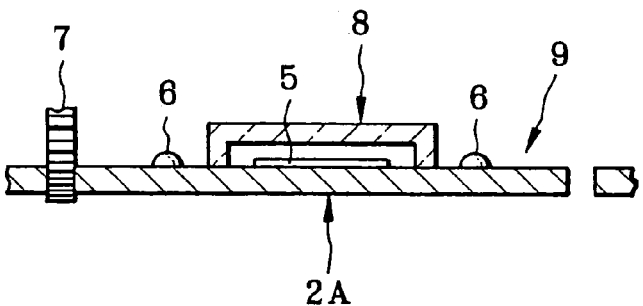
FIG. 2F is an explanatory view in section, illustrating a dicing process of the wafer.

In FIG. 2E, a dicing blade 7 is positioned above the contact points 6, and used to dice the glass plate 3. A shield glass 8 is obtained from the glass plate 3, and covers the light receiving surface 5 with a space from the same.

Then the wafer 2 is diced by the dicing blade 7 to form a solid state pickup device 9 with the imaging element 2A. See FIG. 2F. For dicing, the dicing blade 7 is a diamond blade having a thickness of tens of microns. The dicing blade 7 is rotated at a high speed, so that end faces of the imaging element 2A for the solid state pickup device 9 can be formed with high precision.

Figure 4:
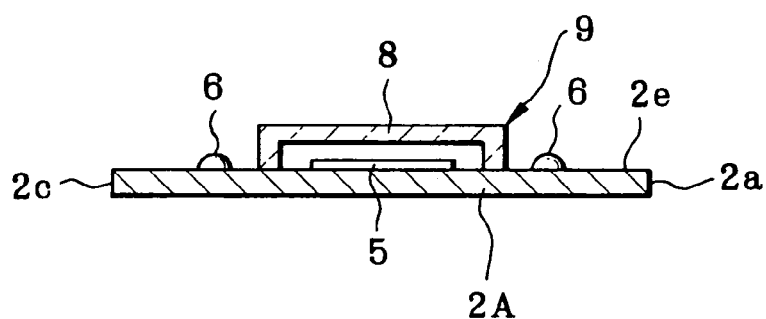
FIG. 4 is a cross section illustrating the solid state pickup device.
Figure 5:
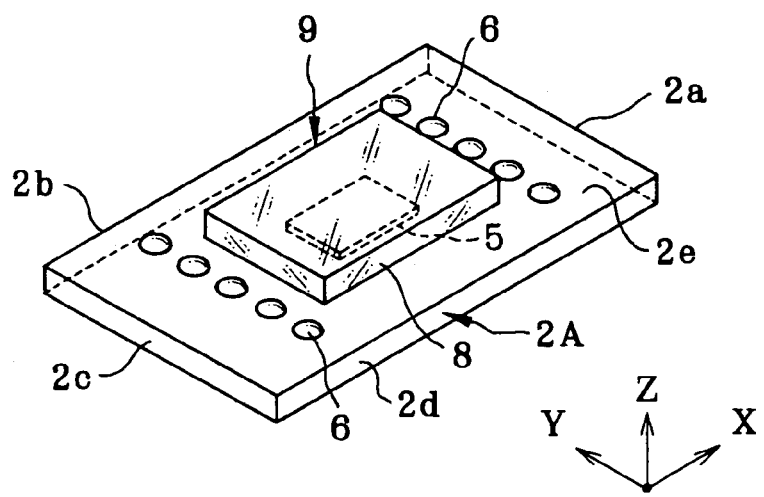
FIG. 5 is a perspective illustrating the solid state pickup device.

In FIG. 4, a completed form of the solid state pickup device 9 is illustrated in section. In FIG. 5, the appearance of the solid state pickup device 9 is illustrated. The light receiving surface 5 and the contact points 6 are arranged on the imaging element 2A. The light receiving surface 5 is covered by the shield glass 8 with a space. End faces 2a and 2b of the imaging element 2A are used for positioning in the directions X and Y. A front face 2e of the imaging element 2A is used for positioning in the optical axis direction Z.

Figure 6:
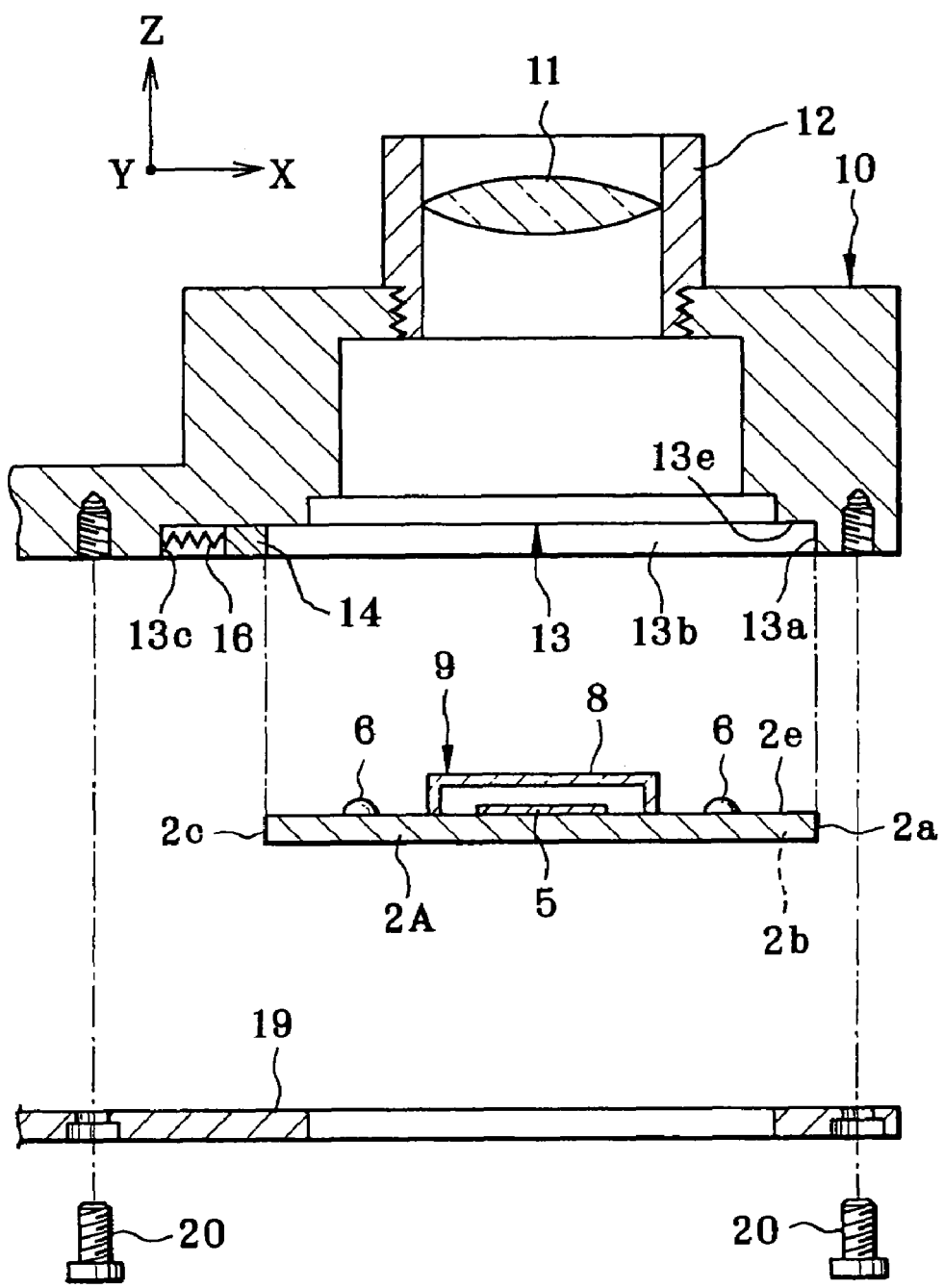
FIG. 6 is a cross section illustrating a lens holder barrel with the solid state pickup device.
Figure 7:
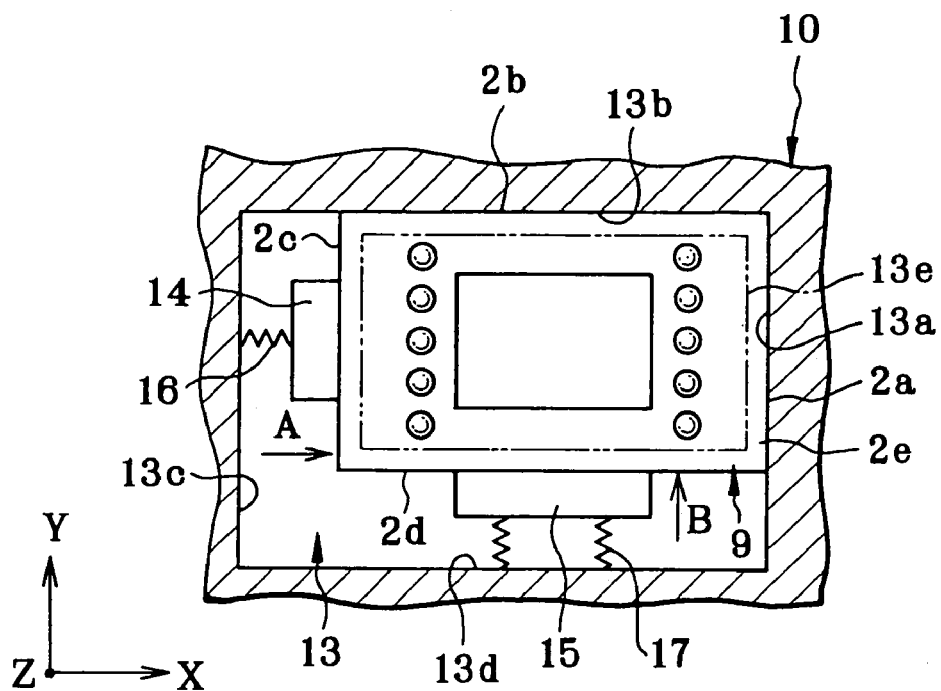
FIG. 7 is a top plan, partially broken, illustrating lens holder barrel.
Figure 8:
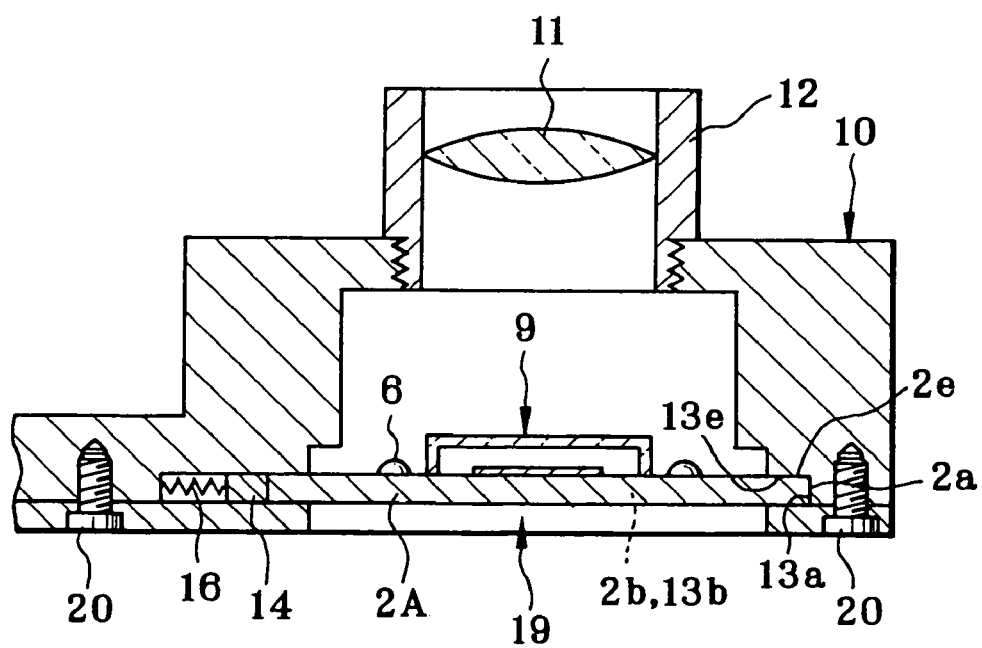
FIG. 8 is a cross section illustrating an attached state of the solid state pickup device to the lens holder barrel.

Referring to FIGS. 6-8, a method of attaching and positioning the solid state pickup device 9 to a lens barrel in an electronic camera is described.

In FIG. 6, elements similar to those of the solid state pickup device 9 in FIG. 4 are designated with identical reference numerals.

In FIG. 6, a holder barrel 10 or body is illustrated in a vertical section. A lens barrel 12 is helically coupled with and fixed on the holder barrel 10. A condenser lens 11 is contained in the lens barrel 12, and positioned on an optical path of incident light. A receiving recess 13 is formed in an inner wall of the holder barrel 10. The receiving recess 13 includes faces 13a, 13b and 13e. The face 13a is oriented perpendicularly to the direction X. The face 13b is oriented perpendicularly to the direction Y. The face 13e is oriented perpendicularly to the optical axis direction Z.

In the imaging element 2A of the solid state pickup device 9, the end face 2a is used as a reference for positioning in the direction X that is horizontal. The end face 2b is used as a reference for positioning in the direction Y that is vertical. The front face 2e is used as a reference for positioning in the direction Z of an optical axis toward the front. The solid state pickup device 9 is inserted in the receiving recess 13 of the holder barrel 10. The end faces 2a and 2b and the front face 2e are opposed to and engaged with the faces 13a, 13b and 13e.

In FIG. 7, the holder barrel 10 is illustrated in a horizontal section. A pressure pad 14 is disposed at a face 13c for pressing an end face 2c of the imaging element 2A in a direction A to keep the end face 2a in contact with the face 13a. A pressure pad 15 is disposed at a face 13d for pressing an end face 2d of the imaging element 2A in a direction B to keep the end face 2b in contact with the face 13b. Springs 16 and 17, for example, compression coil springs, bias respectively the pressure pads 14 and 15.

A rear panel 19 is fixedly secured to the rear of the holder barrel 10 with screws 20. Force is applied to the imaging element 2A. The front face 2e of the imaging element 2A is engaged with the face 13e of the receiving recess 13. In FIG. 8, the imaging element 2A is exactly positioned by contact of the end faces 2a and 2b and the front face 2e with the faces 13a, 13b and 13e. The solid state pickup device 9 is attached to the inside of the holder barrel 10.

In this embodiment, the precision in positioning the solid state pickup device 9 with the optical axis of the condenser lens 11 is determined according to the precision in size of the receiving recess 13 of the holder barrel 10, and the precision in dicing of the imaging element 2A from the wafer 2 in the solid state pickup device 9. Thus, the solid state pickup device 9 can be positioned with higher precision than the prior art in which pins, a package and other members are used.

Figure 9:
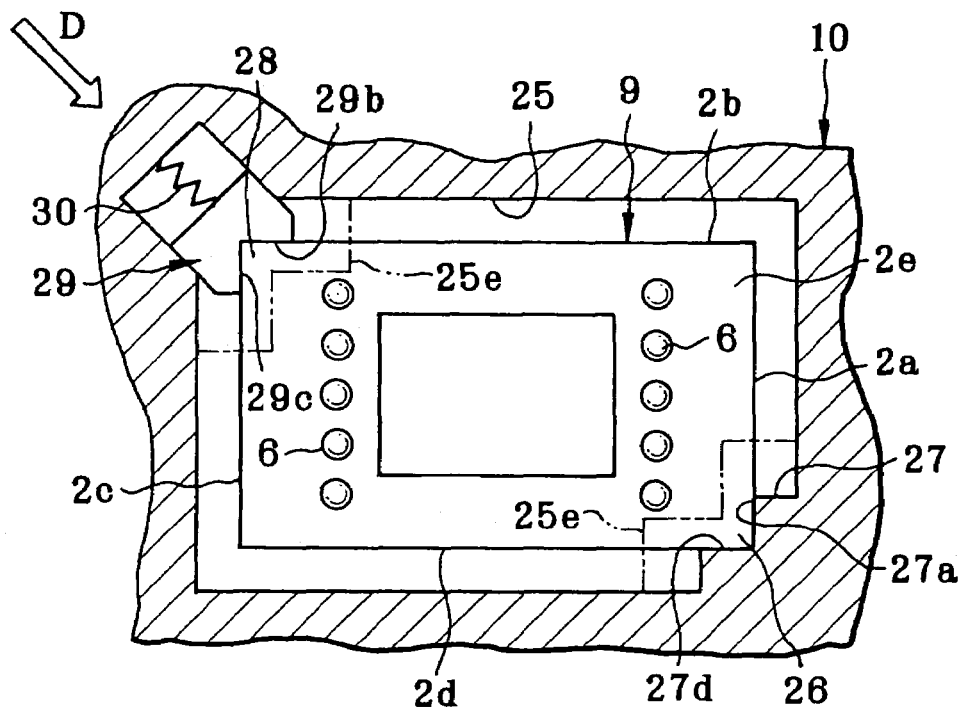
FIG. 9 is a top plan, partially broken, illustrating another preferred attached state of the solid state pickup device.

FIG. 9 is now referred to. A preferred embodiment is described, in which the imaging element 2A is pressed in a direction along its diagonal line for positioning.

A receiving recess 25 is formed in an inner wall of the holder barrel 10 for receiving the solid state pickup device 9. At one end of the receiving recess 25, a notch portion 27 in a stepped shape is formed, opposed to a corner 26 of the imaging element 2A. There are faces 27a and 27d of the notch portion 27 for contacting the end faces 2a and 2d of the imaging element 2A for positioning.

A pressure pad 29 is contained movably in a corner portion of the receiving recess 25 opposed to the notch portion 27. A corner 28 of the imaging element 2A is located diagonally opposite to the corner 26. A spring 30 biases the pressure pad 29. The pressure pad 29 includes two faces 29b and 29c, which contact respectively the end faces 2b and 2c.

A face 25e is located at a front portion of the receiving recess 25, and contacts the front face 2e of the imaging element 2A. The face 25e is in a position offset from the notch portion 27 and the corner 28 toward the front.

When the solid state pickup device 9 is inserted in the receiving recess 25 of the holder barrel 10, the pressure pad 29 presses the corner 28 of the imaging element 2A in the direction D. Thus, the end faces 2a and 2d in the periphery of the imaging element 2A are contacted by the faces 27a and 27d of the notch portion 27. In a manner similar to the above embodiment, the rear panel is secured to the rear of the holder barrel 10, to set the front face 2e in contact with the face 25e. Thus, the solid state pickup device 9 is positioned and fixed in the holder barrel 10.

In the above embodiment, the inner wall of the holder barrel 10 is directly cut out with a right angle. However, it is possible to prepare additional members formed in a stepped shape and retained on the inner wall of the holder barrel 10.

Figure 10:
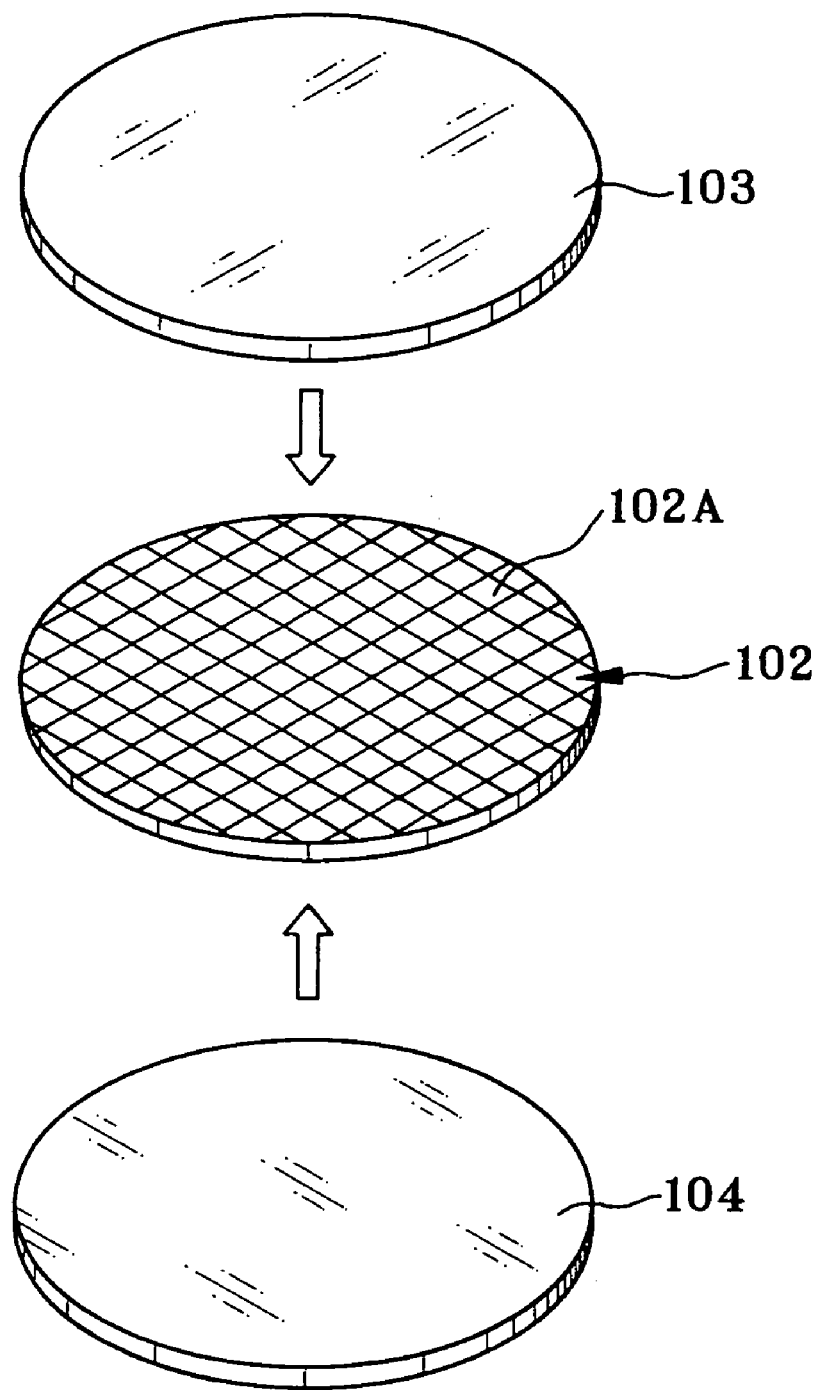
FIG. 10 is a perspective illustrating a producing process according to one preferred embodiment, in which plates are attached to a wafer for a solid state pickup device.

Another preferred embodiment is described now. In FIG. 10, there is a wafer 102, to which a shield glass plate 103 and a reinforcing glass plate 104 are attached by adhesion. The wafer 102, the shield glass plate 103 and the reinforcing glass plate 104 are diced to produce a solid state pickup device. For dicing, a diamond blade having a thickness of tens of microns is used.

Figure 11:
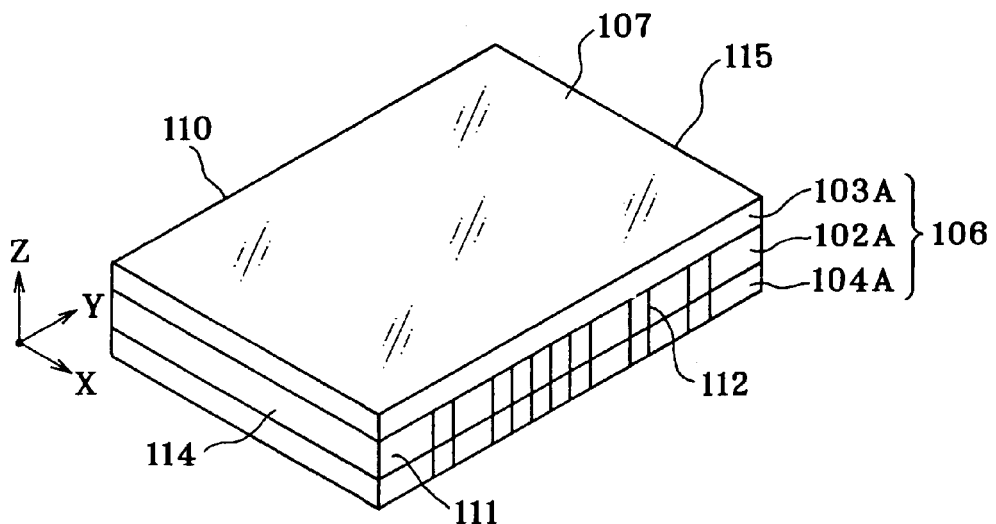
FIG. 11 is a perspective illustrating the solid state pickup device.
Figure 12:
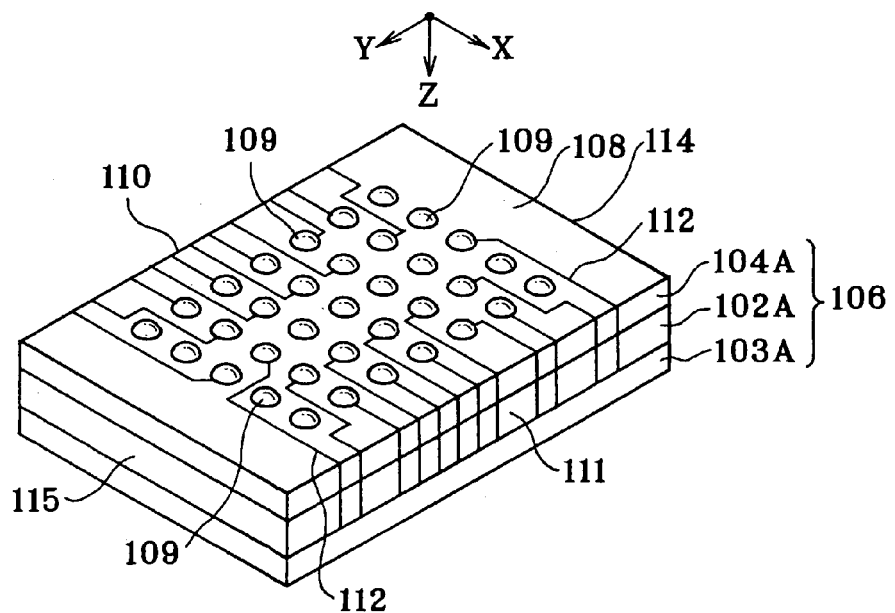
FIG. 12 is a perspective illustrating the same as FIG. 11 but as viewed from a bottom side.

In FIGS. 11 and 12, a solid state pickup device 106 obtained after the dicing is illustrated. The solid state pickup device 106 has a shape of a rectangular quadrilateral. A front face 107 of a shield glass layer 103A is provided with high smoothness. A rear face 108 of a reinforcing glass layer 104A is provided with plural contact points 109 for connection with an electronic equipment when the solid state pickup device 106 is assembled in the same. The contact points 109 are connected with wiring pattern 112, which extends from between an imaging element 102A and the shield glass layer 103A, to lateral faces 110 and 111 of the solid state pickup device 106 along the longer side lines, and then toward the rear face 108. The solid state pickup device 106 is used in a state without being packaged.

There is no wiring along shorter side lines of the solid state pickup device 106. An end face 114 as engageable edge and an end face 115 along the shorter side line are smoothly formed. Also, portions of the rear face 108 near to the shorter side lines are smoothly formed. At ends of the lateral faces 110 and 111, there are smooth surfaces having no wiring.

Figure 13:
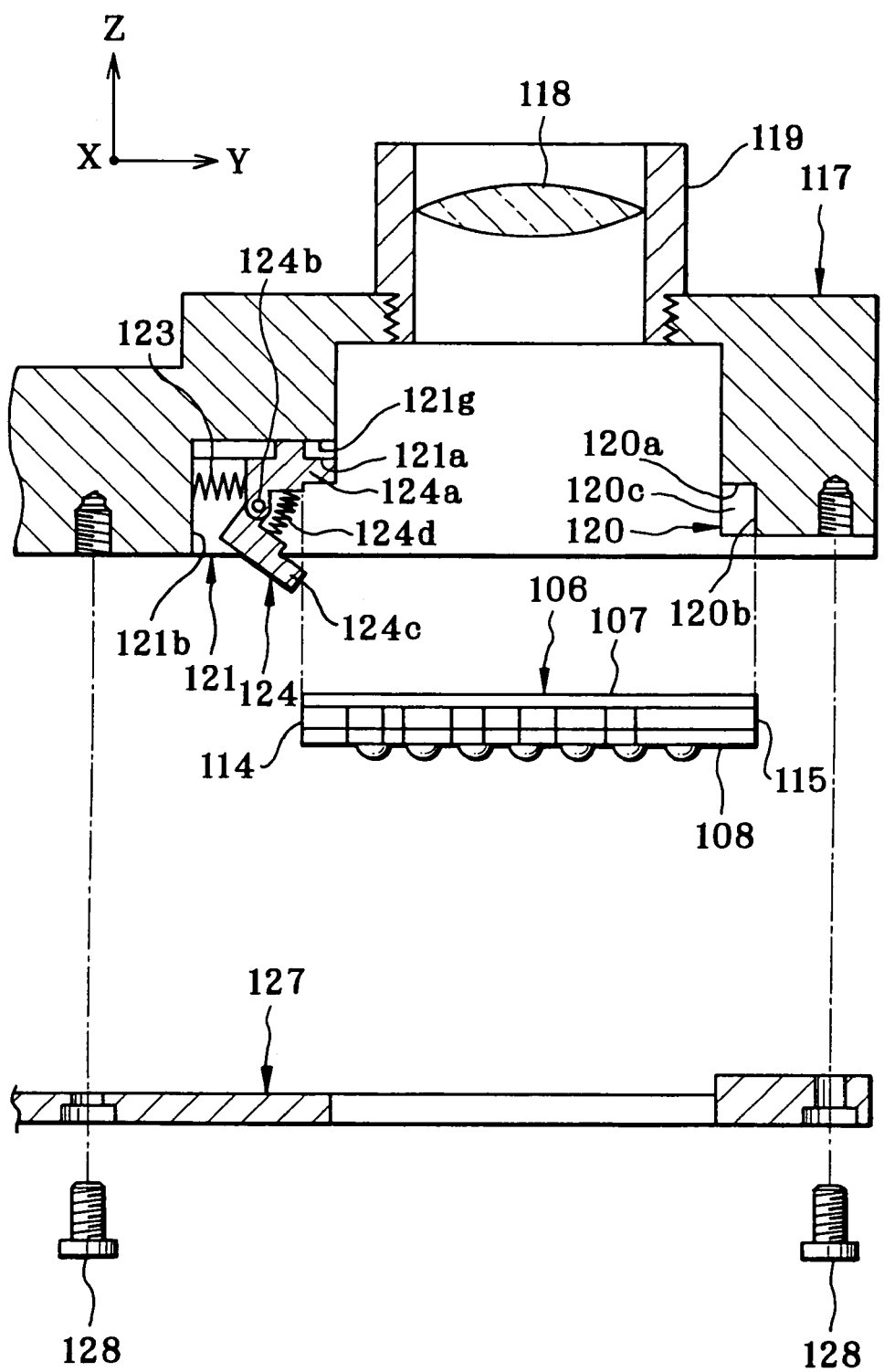
FIG. 13 is a cross section illustrating a body of an electronic camera with the solid state pickup device.
Figure 14:
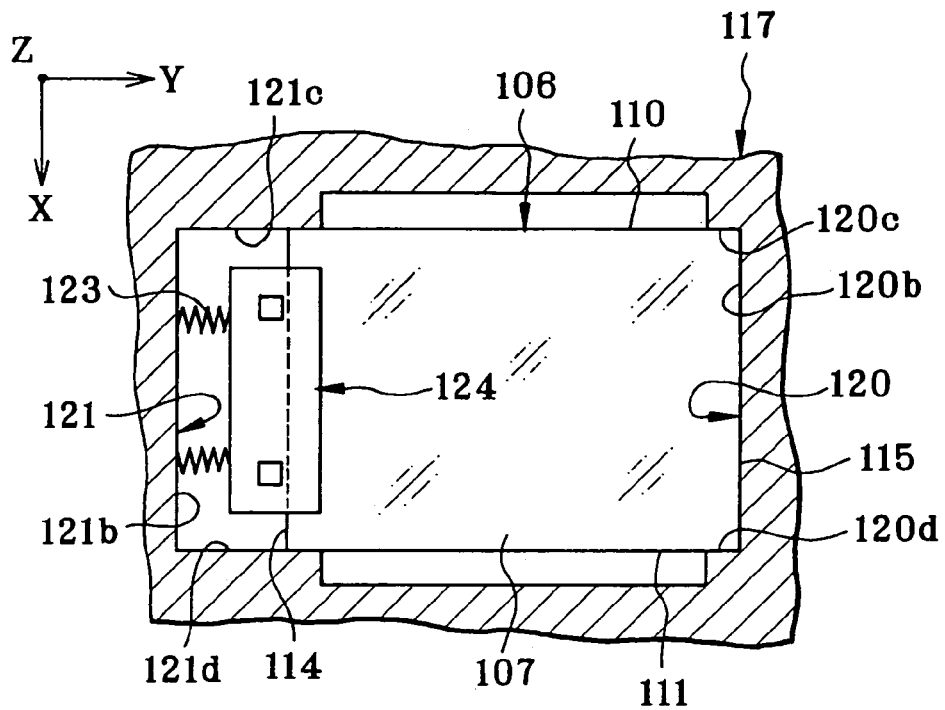
FIG. 14 is a horizontal section, partially broken, illustrating a lens holder barrel.

Now, the attaching method is described. In FIGS. 13 and 14, a condenser lens 118 is supported inside a lens barrel 119. The lens barrel 119 is helically coupled with and fixed on a holder barrel 117 or body.

A receiving recess 120 is constituted by faces 120a, 120b, 120c and 120d. The face 120a constitutes an inner portion, and is perpendicular to the optical axis direction Z. The face 120b constitutes an inner portion, and is perpendicular to the direction Y. The faces 120c and 120d are perpendicular to the direction X. Similarly, a containing recess 121 is constituted by faces 121a, 121b, 121c and 121d. The face 121a is perpendicular to the optical axis direction Z. The face 121b is perpendicular to the direction Y. The faces 121c and 121d are perpendicular to the direction X.

An interval between the faces 120b and 121b is predetermined longer than a size of the solid state pickup device 106 in its lengthwise direction Y. An interval between the faces 120c and 120d, and an interval between the faces 121c and 121d are predetermined equal to that between the lateral faces 110 and 111, namely a size of the solid state pickup device 106 in the widthwise direction X. Note that there is a recess extending between the faces 120c and 121c. A recess extends between the faces 120d and 121d. The recesses operate for avoiding interference with the wiring pattern 112 of the solid state pickup device 106.

A clamper 124 in the pressure mechanism is incorporated in the containing recess 121, and slidable in the direction Y. A spring element 123 or compression coil spring biases the clamper 124 toward the receiving recess 120. The clamper 124 includes a front clamp jaw 124a, a rear clamp jaw 124c and a tension coil spring 124d. The front clamp jaw 124a includes a front projection, which frictionally contacts the face 121a of the containing recess 121, and inserted in a groove 121g of the face 121a. The rear clamp jaw 124c is supported on the front clamp jaw 124a rotatably at a pivot 124b, and movable between open and closed positions. The tension coil spring 124d is connected between the front and rear clamp jaws 124a and 124c, for biasing the rear clamp jaw 124c toward the closed position.

A portion of the solid state pickup device 106 along one shorter side line is inserted in the receiving recess 120 of the holder barrel 117. The front face 107 and the end face 115 of the solid state pickup device 106 are opposed to respectively the faces 120a and 120b of the receiving recess 120. An opposite portion of the solid state pickup device 106 along a remaining shorter side line is inserted between the front and rear clamp jaws 124a and 124c of the clamper 124, to clamp the front face 107 and the rear face 108 in the clamper 124. The lateral faces 110 and 111 of the solid state pickup device 106 along the longer side lines are contacted by the faces 120c and 120d of the receiving recess 120 and by the faces 121c and 121d of the containing recess 121. Thus, the solid state pickup device 106 is positioned in the direction X on the holder barrel 117.

The clamper 124 is biased by the spring element 123, and presses the solid state pickup device 106 toward the receiving recess 120. The end face 115 of the solid state pickup device 106 contacts the receiving recess 120, to position the solid state pickup device 106 in the direction Y.

Figure 15:
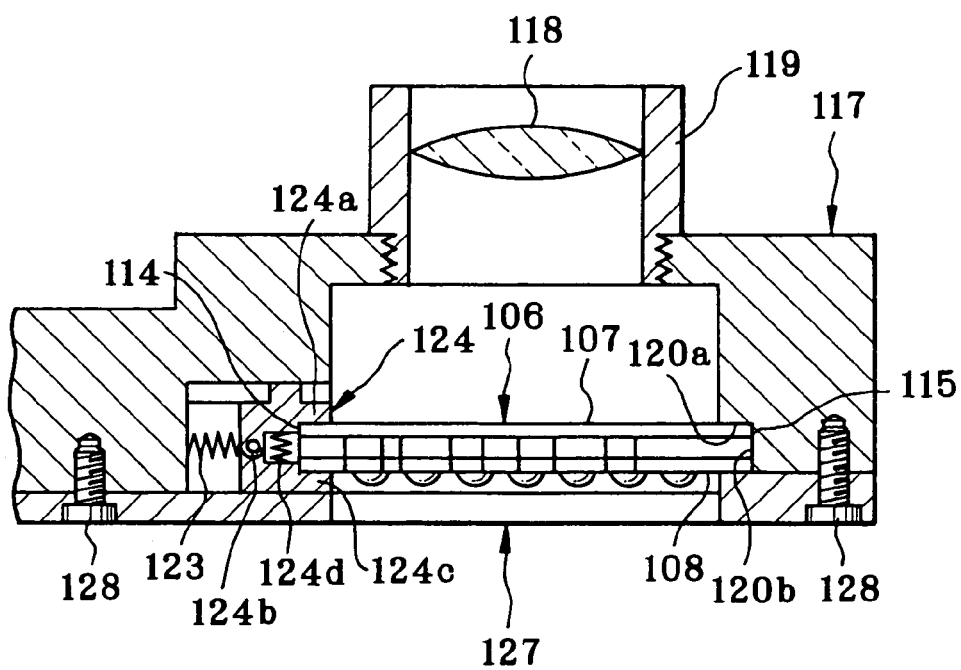
FIG. 15 is a cross section illustrating an attached state of the solid state pickup device.

Then a rear panel 127 is fixedly secured to the rear of the holder barrel 117 with screws 128. See FIG. 15. Force is applied by the rear panel 127 to the solid state pickup device 106 and the clamper 124 in the optical axis direction Z. The front face 107 of the solid state pickup device 106 is engaged with the face 120a of the receiving recess 120. A front face of the clamper 124 is contacted by the face 121a of the containing recess 121. Accordingly, the solid state pickup device 106 is positioned in the optical axis direction Z, and is finally fixed.

Figure 16:
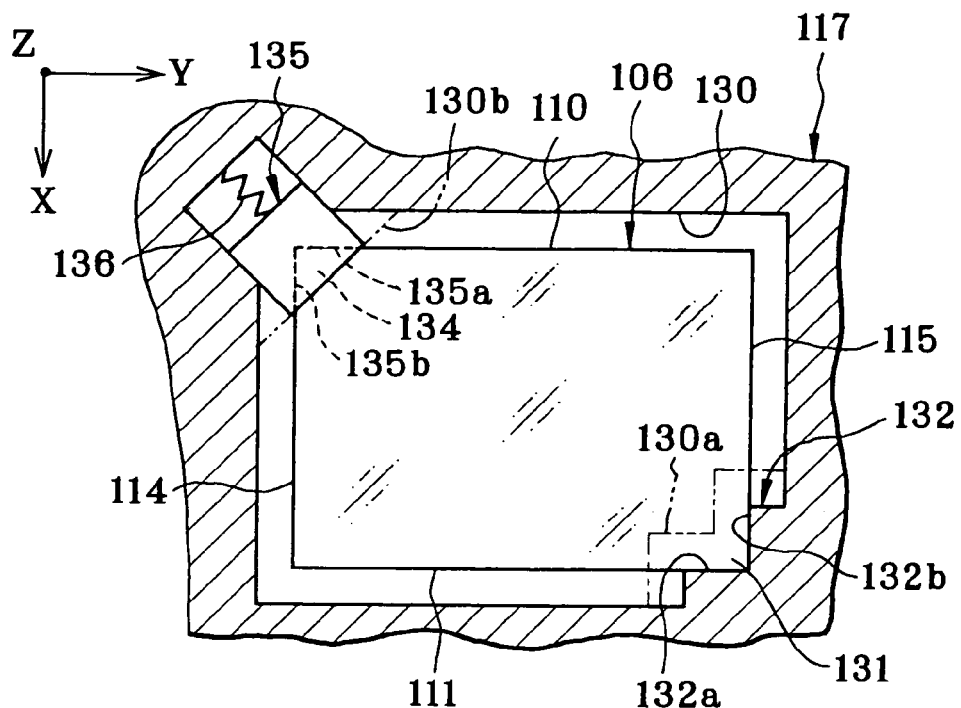
FIG. 16 is a horizontal section, partially broken, illustrating an additional preferred attached state of the solid state pickup device.

FIG. 16 is referred to now. A preferred embodiment is illustrated, in which a corner of the solid state pickup device 106 is used for positioning. A receiving chamber 130 is formed in an inner wall of the holder barrel 117 for placement of the solid state pickup device 106. The solid state pickup device 106 has a corner 131. A receiving notch 132 or recess in a stepped shape is formed inside the receiving chamber 130, and opposed to the corner 131. Faces 132a and 132b are included in the receiving notch 132, and opposed to the lateral face 111 and the end face 115 of the solid state pickup device 106.

A clamper 135 in a pressure mechanism is movably contained in a corner portion of the receiving chamber 130 opposite to the receiving notch 132. The clamper 135 clamps an engageable corner 134 of the solid state pickup device 106 diagonally opposite to the corner 131. In the manner similar to the clamper 124, the clamper 135 squeezes the engageable corner 134 in the vertical direction upwards and downwards. A spring element 136 biases the clamper 135, and presses the solid state pickup device 106 toward the corner 131. Faces 135a and 135b of the clamper 135 are engaged with the lateral face 110 and the end face 114 of the solid state pickup device 106.

Faces 130a and 130b are included in the receiving chamber 130. The face 130a is disposed in front of the receiving notch 132, and contacted by the front face 107 of the solid state pickup device 106. The face 130b is disposed in front of the clamper 135, and contacted by a front face of the clamper 135.

Figure 17:
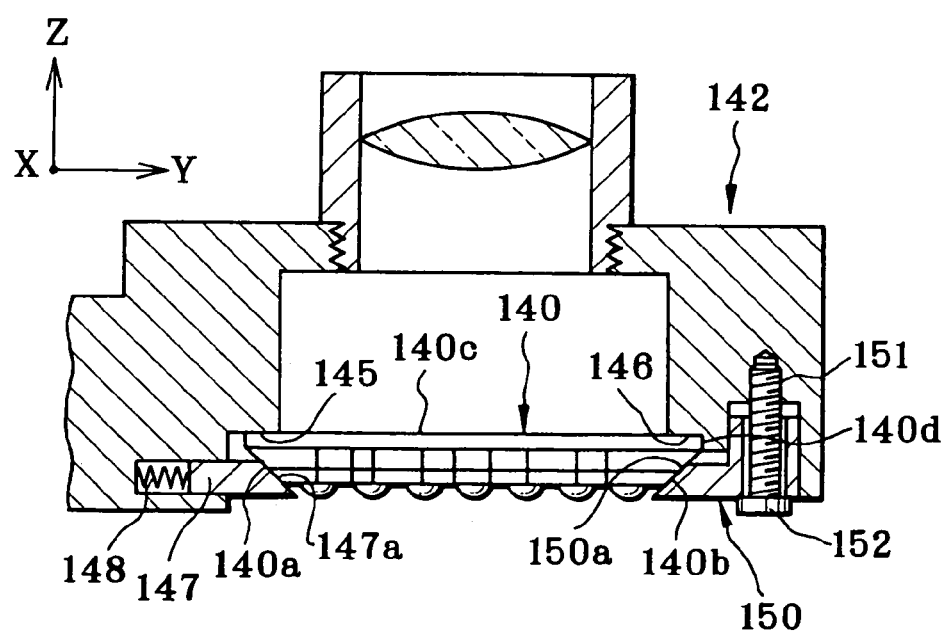
FIG. 17 is a cross section illustrating a further preferred attached state of the solid state pickup device.

In FIG. 17, another preferred solid state pickup device 140 is depicted. An inclined surface 140a with an engageable edge, and an inclined surface 140b are used effectively in positioning and fixing the solid state pickup device 140 in a lens barrel 142 or a holder barrel.

The inside of the lens barrel 142 has a receiving recess 145. A front face 140c of the solid state pickup device 140 is engaged with the inside of the receiving recess 145. Also, there is a receiving recess 146 with which the front face 140c and an end face 140d are engaged. Note that there is no wiring on the end face 140d. A pressure pad 147 in a pressure mechanism is disposed under the receiving recess 145, and includes an inclined surface 147a for engagement with the inclined surface 140a of the solid state pickup device 140. A spring element 148 in the pressure mechanism exerts biasing force to cause the pressure pad 147 to press the solid state pickup device 140 toward the receiving recess 146. A retention member 150 is disposed under the receiving recess 146, and has an inclined surface 150a for engagement with the inclined surface 140b of the solid state pickup device 140. A screw 152 is used for adjusting the position of the retention member 150 in the optical axis direction Z by helical coupling with a screw hole 151 formed in the lens barrel 142.

When the solid state pickup device 140 is inserted in the receiving recesses 145 and 146 of the lens barrel 142, the pressure pad 147 presses the inclined surface 140a. A component of force of the pressure pad 147 causes the front face 140c to contact front faces of the receiving recesses 145 and 146 while the inclined surface 140a is pressed. The end face 140d contacts the lateral face of the receiving recess 146. Then the screw 152 is fastened, to press the inclined surface 150a of the retention member 150 against the inclined surface 140b of the solid state pickup device 140. Thus, the tightness in the contact between the solid state pickup device 140 and the receiving recesses 145 and 146 is raised, to position and fix the solid state pickup device 140 finally.

In the above embodiments, the solid state pickup device is attached to the lens barrel. However, the attaching method of the invention may be used for a body, chassis or the like of any suitable electronic instrument other than an electronic camera.

Figure 18:
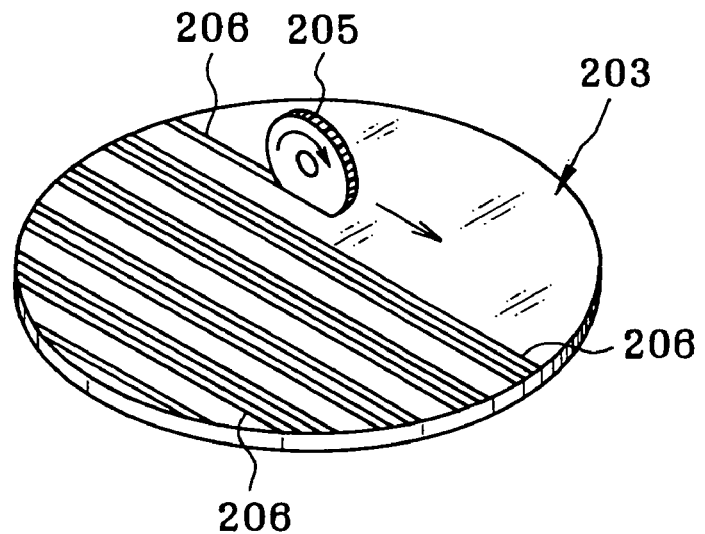
FIG. 18 is a perspective illustrating a producing process according to another preferred embodiment, in which grooves are formed in a shield glass plate for a solid state pickup device.
Figure 25:
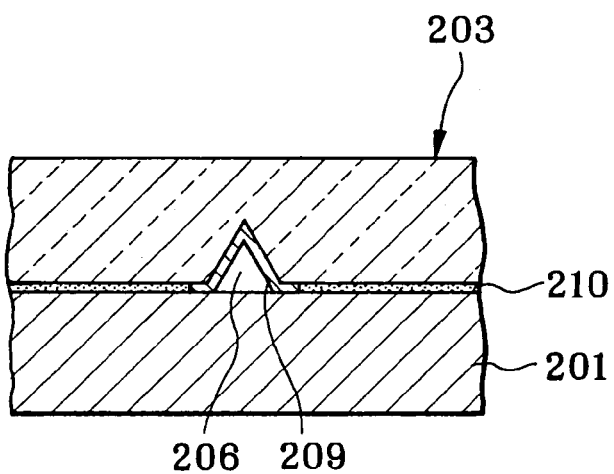
FIG. 25 is a perspective illustrating a state of the shield glass plate attached to a wafer.

Still another preferred embodiment is described with reference to FIGS. 18-29, in which auxiliary panels are used for positioning of a solid state pickup device without using a package. To produce the solid state pickup device, elements for layers are laid on one another in the same manner as FIG. 10. A wafer 201 of FIG. 25 is formed from silicon. Plural imaging elements 201A of FIG. 26 as chips are arranged in the wafer 201 in a form of a grid. A shield glass plate 203 of FIG. 18 is attached to the wafer 201 by adhesion on the side of the chips. On an opposite side, a reinforcing glass plate is attached to the wafer 201 by adhesion. After the three-layered structure is obtained, the wafer 201, the shield glass plate 203 and the reinforcing glass plate are diced, to produce a solid state pickup device as single device with one imaging element 201A.

In FIG. 18, a process of working the shield glass plate 203 in the manufacture of a solid state pickup device is illustrated. Two methods, including dicing and etching, can be used to form grooves in the shield glass plate 203. To dice grooves, a dicing cutter 205 is actuated, and cuts a surface of the shield glass plate 203 while moved. Then plural grooves 206 are formed in a parallel form.

Figure 19:
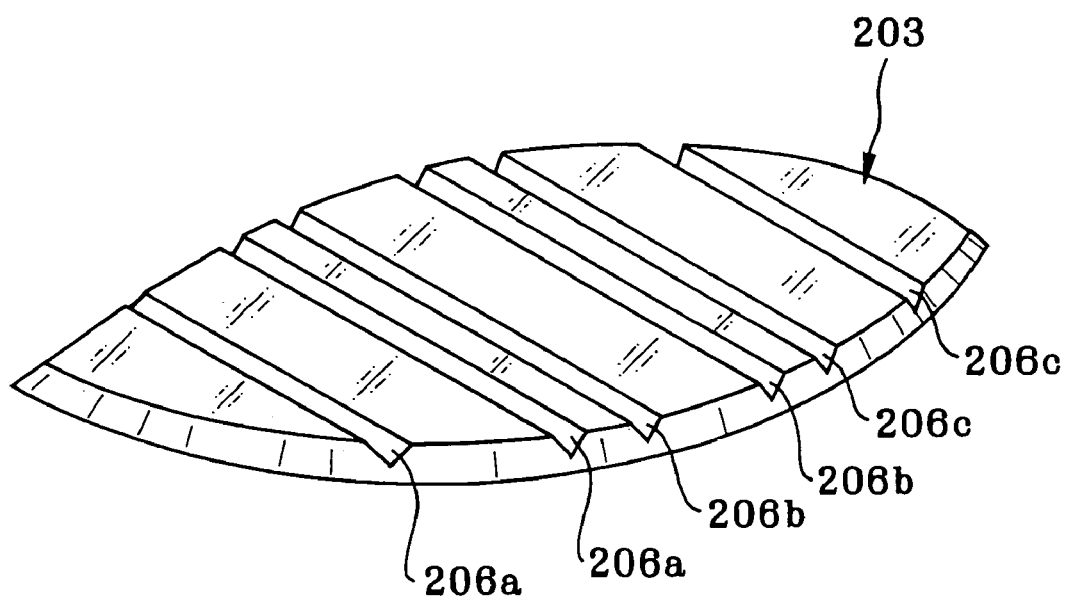
FIG. 19 is a perspective, partially broken, illustrating disposition of the grooves in enlargement.

In FIG. 19, disposition of the grooves 206 formed in the surface of the shield glass plate 203 is illustrated. In a first groove pair, grooves 206a are arranged at a regular interval which is determined larger than a width of a light receiving surface constituting one imaging element 201A. Other pairs of grooves 206b and 206c are arranged in the same manner as the grooves 206a.

Figure 20:
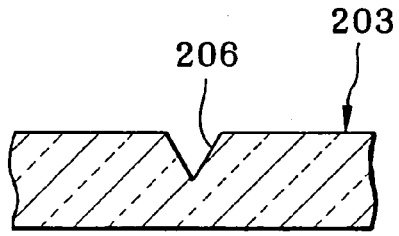
FIG. 20 is a cross section illustrating each groove.
Figure 21:
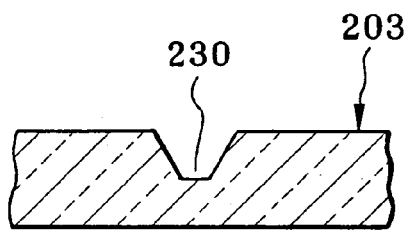
FIG. 21 is a cross section illustrating another preferred shape of each one groove.
Figure 22:
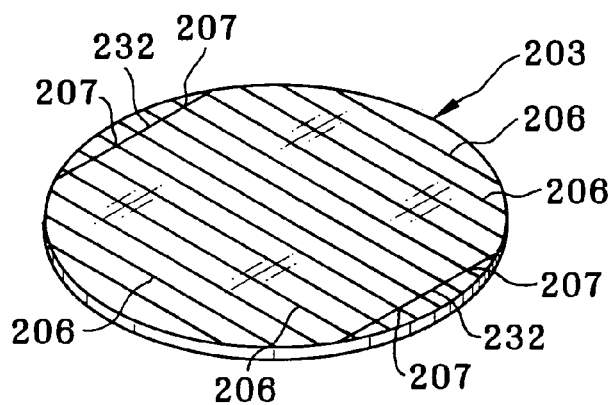
FIG. 22 is a perspective illustrating a shield glass plate provided with positioning line indicia.

In FIG. 20, a shape of the grooves 206 in the shield glass plate 203 is illustrated. The grooves 206 have a triangular shape as viewed in cross section. In FIG. 21, another example of groove 230 is depicted, which has a shape of a trapezoid as viewed in cross section. In addition, grooves may have any suitable shape as viewed in section.

After the grooves 206 are formed, the shield glass plate 203 is attached to the wafer 201. To ensure precision in the attaching the shield glass plate 203 to the wafer 201, it is preferable to form reference indicia to both of those. As the grooves 206 are formed by dicing, positioning line indicia 232 are formed on the shield glass plate 203 to cross the grooves 206. See FIG. 22. Points of intersection between the positioning line indicia 232 and the grooves 206 are determined as reference indicia 207 for the attachment. Also, the wafer 201 is provided with corresponding reference indicia. The shield glass plate 203 is placed on the wafer 201 by positioning the reference indicia on one another.

It is to be noted that an example of the positioning line indicia 232 is a groove formed by dicing.

Figure 23:
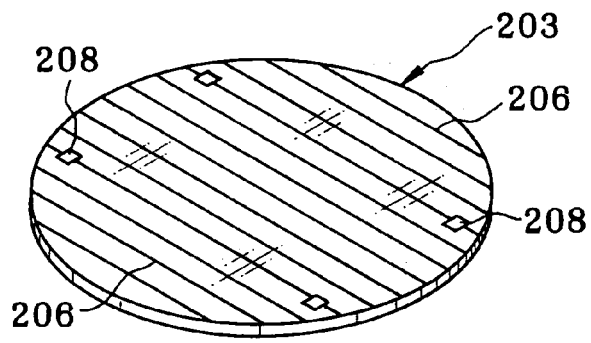
FIG. 23 is a perspective illustrating another shield glass plate provided with positioning indicia by etching.
Figure 24:
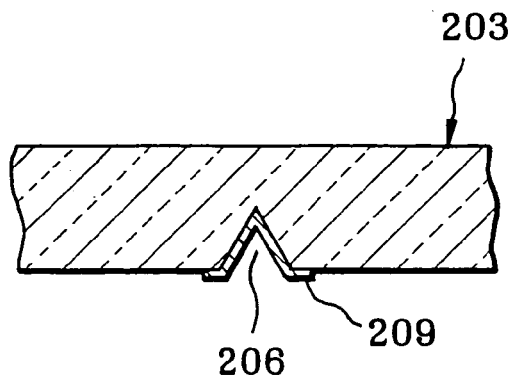
FIG. 24 is a cross section illustrating an embodiment in which a coating is provided on a surface of each groove.

If etching is selected and used to form the grooves 206 in the shield glass plate 203, it is easily possible to form positioning indicia 208 of FIG. 23. At the same time as the grooves 206 are formed, the positioning indicia 208 are etched on the shield glass plate 203 and formed in positions adapted for positioning of the shield glass plate 203 on the wafer 201.

Before the shield glass plate 203 is attached to the wafer 201, surfaces of the grooves 206 in the shield glass plate 203 are coated with a coating 209 of a fluorine compound for repelling adhesive agent. See FIG. 24. In FIG. 25, an attached state of the shield glass plate 203 and the wafer 201 is partially illustrated. Adhesive agent 210 is used to attach the shield glass plate 203 to the wafer 201. However, the grooves 206 are kept in a recessed form, because the coating 209 repels the adhesive agent 210 and maintains the shape of the grooves 206.

Figure 26:
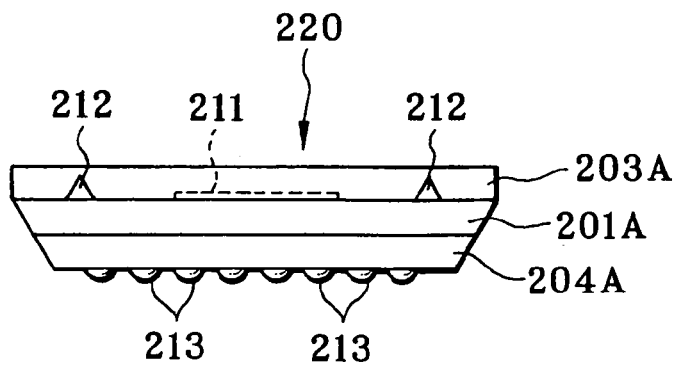
FIG. 26 is a side elevation illustrating a solid state pickup device.

In FIG. 26, a solid state pickup device 220 in an electronic camera is viewed in a side elevation. A light receiving surface 211 is included in the imaging element 201A, which is sandwiched between a shield glass layer 203A and a reinforcing glass layer 204A by adhesion. The solid state pickup device 220 is obtained by dicing the wafer 201, the shield glass plate 203 and the reinforcing glass plate respectively for the light receiving surface 211 after the adhesion. Two pairs of end openings 212 are open in lateral faces of the solid state pickup device 220 as ends of the grooves 206 in the shield glass layer 203A. Positions of the end openings 212 are offset from the light receiving surface 211. Plural contact points 213 are formed on a surface of the reinforcing glass layer 204A, and are used for connection with leads.

Figure 27:
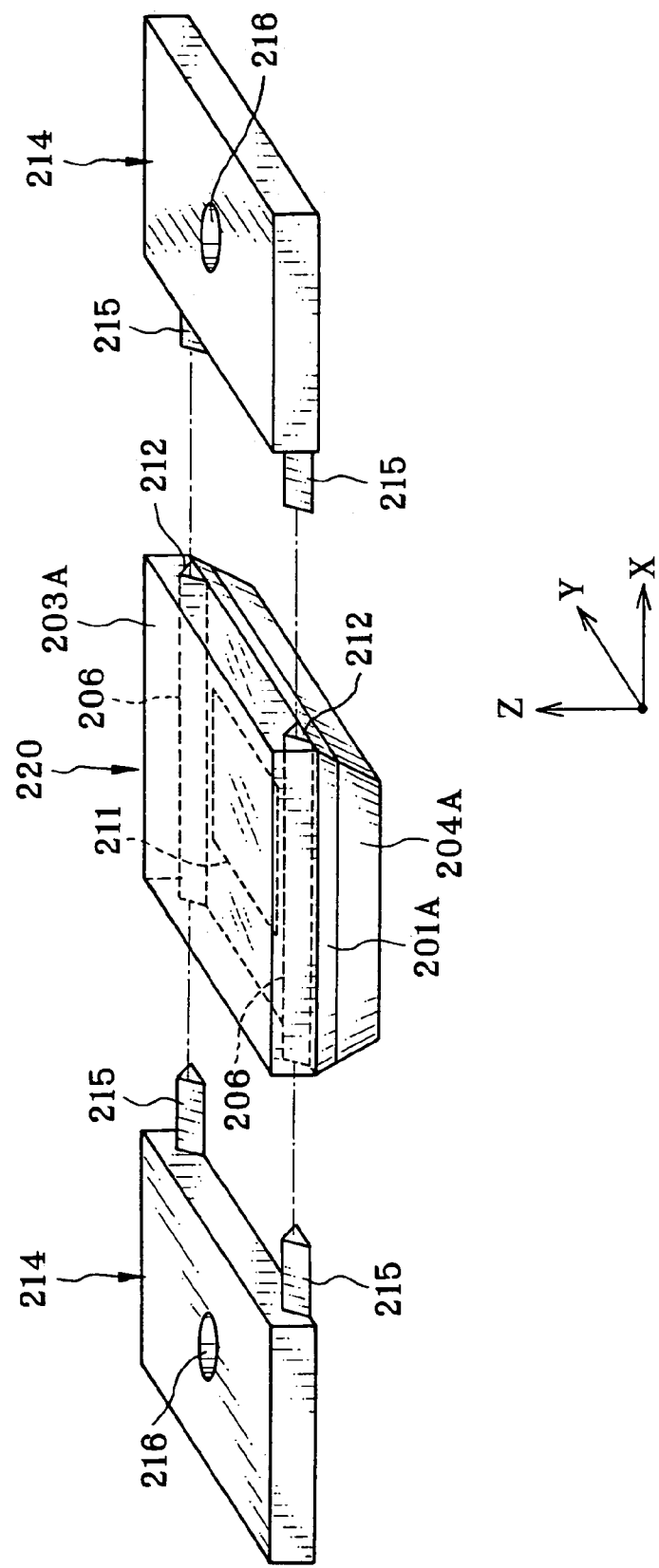
FIG. 27 is a perspective illustrating the solid state pickup device together with two auxiliary panels.

In FIG. 27, a preferred embodiment of the solid state pickup device 220 is illustrated. The grooves 206 formed in the shield glass layer 203A are in positions offset from the light receiving surface 211 at the optical path. The grooves 206 are arranged so that the light receiving surface 211 is located between those. The end openings 212 where the grooves 206 open externally are disposed in lateral faces of the shield glass layer 203A.

Figure 28:
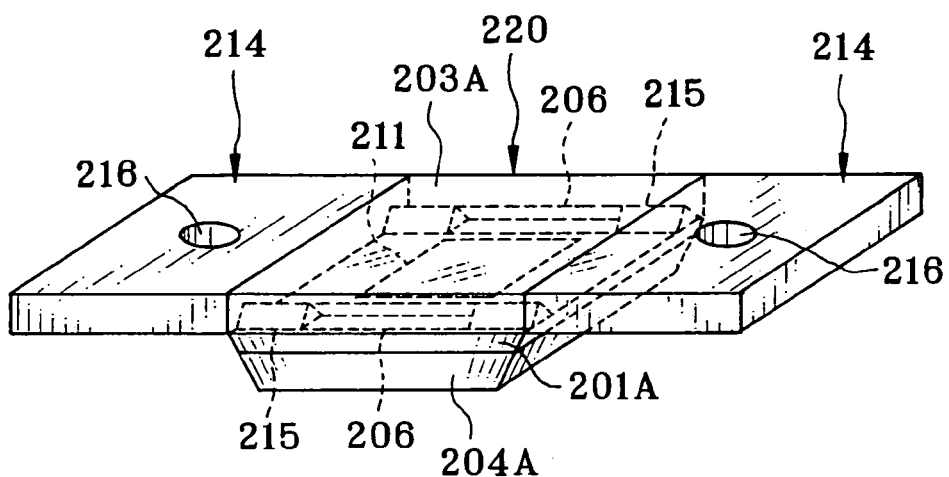
FIG. 28 is a perspective illustrating the same as FIG. 27 but in a connected state.

First and second auxiliary panels 214 are connected with lateral faces of the solid state pickup device 220. A pair of projections 215 are formed to project from each of the auxiliary panels 214. The projections 215 of each pair are inserted into two of the end openings 212 on one lateral face of the solid state pickup device 220. In FIG. 28, the lateral faces of the shield glass layer 203A come in contact with the auxiliary panels 214 upon fully inserting the projections 215 into the end openings 212. The lateral faces of the shield glass layer 203A operate as a reference surface of positioning the auxiliary panels 214 in the direction X.

In engagement of the projections 215 with the grooves 206, surfaces of contact of the projections 215 of the auxiliary panels 214 with the inside of the grooves 206 are used as reference surfaces of positioning in the directions Y and Z. Thus, the projections 215 and the grooves 206 cooperate for positioning the shield glass layer 203A on the auxiliary panels 214 in the directions Y and Z.

Figure 29:
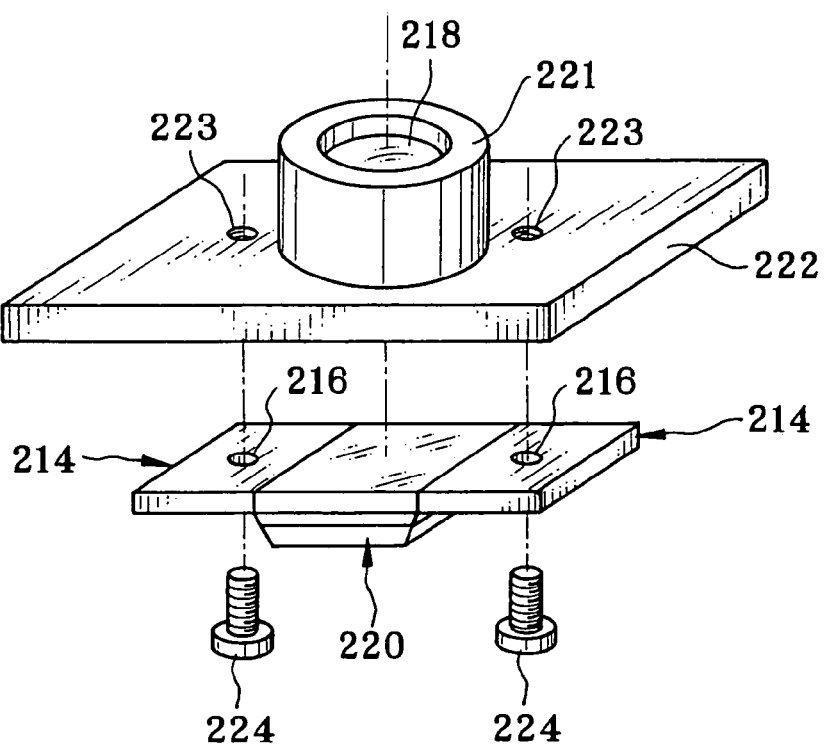
FIG. 29 is a perspective illustrating a state of attaching the solid state pickup device to a lens holder with the auxiliary panels.

A hole 216 is formed in each of the auxiliary panels 214. The position of the hole 216 is symmetrical between the auxiliary panels 214 with respect to the solid state pickup device 220. In FIG. 29, an operation of attaching the solid state pickup device 220 to a lens holder is illustrated.

A condenser lens 218 is supported in a lens barrel 221 in the electronic camera. A lens holder 222 supports the lens barrel 221. A pair of screw holes 223 are formed in the lens holder 222 in positions symmetric with each other with respect to the optical axis of the condenser lens 218. The holes 216 in the auxiliary panels 214 on the solid state pickup device 220 are exactly placed on the screw holes 223 in the lens holder 222. Then screws 224 are fastened through those, to attach the solid state pickup device 220 to the lens holder 222.

The solid state pickup device 220 is positioned on the auxiliary panels 214 in all of the direction X, Y and Z. Screws are fastened on the auxiliary panels 214 at the screw holes 223 in the lens holder 222. This is effective in setting an optical axis of the condenser lens 218 exactly on the optical axis of the light receiving surface 211 of the solid state pickup device 220.

In the above embodiment, the auxiliary panels 214 are used to attach the solid state pickup device 220 to the lens barrel 221. However, it is possible to use the auxiliary panels 214 only for positioning and initially setting the solid state pickup device 220 without final attachment. To be precise, extra fixing members are used to fix the solid state pickup device 220 before positioning and setting the solid state pickup device 220 on the lens barrel 221 with the auxiliary panels 214. Finally, the auxiliary panels 214 can be removed from the solid state pickup device 220.

Although the present invention has been fully described by way of the preferred embodiments thereof with reference to the accompanying drawings, various changes and modifications will be apparent to those having skill in this field. Therefore, unless otherwise these changes and modifications depart from the scope of the present invention, they should be construed as included therein.

What is claimed is:

1. A producing method of producing a solid state pickup device, comprising steps of:

forming plural light receiving surfaces on a wafer, each of said light receiving surfaces being adapted to convert incident light of an image to an electric signal;

forming first and second grooves in a shield glass plate substantially in parallel with each other;

attaching said shield glass plate to said wafer by opposing said first and second grooves to positions offset from said light receiving surface, wherein ends of said first and second grooves appear externally;

attaching a reinforcing glass plate to said wafer on a side opposite to said shield glass plate;

dicing said wafer, said shield glass plate and said reinforcing glass plate together for each of said light receiving surfaces, to obtain said solid state pickup device;

inserting first and second projections into end openings of said first and second grooves, said first and second projections projecting from a first auxiliary panel, whereby said first auxiliary panel is connected with said solid state pickup device; and inserting third and fourth projections into end openings of said first and second grooves, said third and fourth projections projecting from a second auxiliary panel, whereby said second auxiliary panel is connected with said solid state pickup device, said first and second auxiliary panels being adapted to attachment to an electronic camera.

2. The producing method as defined in claim 1, wherein said solid state pickup device is positioned in an optical axis direction thereof and in a first direction crosswise to said optical axis direction by engagement of said first and second grooves with said first to fourth projections;

said solid state pickup device is positioned in a second direction crosswise to said optical axis direction by engagement of said shield glass plate with said first and second auxiliary panels.

3. The producing method as defined in claim 2, wherein in said groove forming step, plural pairs of said first and second grooves are formed in said shield glass plate.

4. The producing method as defined in claim 3, wherein said first and second auxiliary panels have holes with which said first and second auxiliary panels are fixed to a lens holder of said electronic camera.

5. The producing method as defined in claim 4, wherein screws are used for fixation with said holes.

6. The producing method as defined in claim 4, further comprising a step of applying a coating to surfaces of said first and second grooves in said shield glass plate, for preventing adhesive agent from being stuck.

7. The producing method as defined in claim 6, further comprising a step of forming a positioning indicia on said shield glass plate at a portion of said first and second grooves, said positioning indicia being adapted for positioning said shield glass plate on said wafer.

8. The producing method as defined in claim 6, wherein said first and second grooves have a triangular shape as viewed in section.

9. The producing method as defined in claim 6, wherein said first and second grooves have a trapezoidal shape as viewed in section.

* * * * *